(12) United States Patent
Li et al.

(10) Patent No.: US 8,551,202 B2
(45) Date of Patent: Oct. 8, 2013

(54) IODATE-CONTAINING CHEMICAL-MECHANICAL POLISHING COMPOSITIONS AND METHODS

(75) Inventors: Shoutian Li, Naperville, IL (US);
Phillip W. Carter, Naperville, IL (US);
Jian Zhang, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 691 days.

(21) Appl. No.: 11/387,558

(22) Filed: Mar. 23, 2006

(65) Prior Publication Data

US 2007/0224919 A1  Sep. 27, 2007

(51) Int. Cl.
*C09G 1/02* (2006.01)
*C09G 1/04* (2006.01)

(52) U.S. Cl.
USPC .............................. 51/307; 438/692; 252/79.1

(58) Field of Classification Search
USPC ......... 51/307–309; 106/3; 438/690–694, 689; 510/175; 451/41; 216/88
See application file for complete search history.

(56) References Cited

U.S. PATENT DOCUMENTS

| | | | |
|---|---|---|---|
| 5,196,353 A | 3/1993 | Sandhu et al. | |
| 5,230,833 A | 7/1993 | Romberger et al. | |
| 5,433,651 A | 7/1995 | Lustig et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 6,355,075 B1 | 3/2002 | Ina et al. | |
| 6,364,920 B1 | 4/2002 | Garg et al. | |
| 6,375,693 B1 | 4/2002 | Cote et al. | |
| 6,409,781 B1 | 6/2002 | Wojtczak et al. | |
| 6,468,137 B1 | 10/2002 | Fang et al. | |
| 6,527,819 B2 | 3/2003 | Wojtczak et al. | |
| 6,599,173 B1 | 7/2003 | Cruz et al. | |
| 6,821,309 B2 | 11/2004 | Singh et al. | |
| 6,936,542 B2 | 8/2005 | Wojtczak et al. | |
| 2001/0013506 A1 | 8/2001 | Chamberlin et al. | |
| 2002/0081865 A1 | 6/2002 | Wojtczak et al. | |
| 2002/0124474 A1 | 9/2002 | Wojtczak et al. | |
| 2003/0139047 A1 | 7/2003 | Thomas et al. | |
| 2004/0077295 A1* | 4/2004 | Hellring et al. | ................. 451/41 |
| 2004/0116313 A1* | 6/2004 | Nosowitz et al. | ............. 510/175 |
| 2004/0144755 A1* | 7/2004 | Motonari et al. | ................ 216/88 |
| 2004/0229461 A1* | 11/2004 | Darsillo et al. | ................ 438/689 |
| 2005/0090104 A1* | 4/2005 | Yang et al. | ..................... 438/689 |
| 2005/0112892 A1* | 5/2005 | Chen et al. | ..................... 438/692 |
| 2005/0215060 A1* | 9/2005 | Oh et al. | ........................ 438/692 |
| 2006/0030158 A1 | 2/2006 | Carter | |

FOREIGN PATENT DOCUMENTS

| | | |
|---|---|---|
| JP | 2001-247853 A | 9/2001 |
| WO | WO 01/83638 A1 | 11/2001 |
| WO | WO 02/20214 A2 | 3/2002 |
| WO | WO 2005/016822 | 2/2005 |
| WO | WO 2006/133249 | 12/2006 |

OTHER PUBLICATIONS

Anik, "Reduction Characteristics of Iodate Ion on Copper: Application to Copper Chemical Mechanical Polishing," *Journal of Applied Electrochemistry*, 34(9): 963-969 (Sep. 2004).

Kuiry et al., "Effect of pH and $H_2O_2$ on Ta Chemical Mechanical Planarization," *Journal of the Electrochemical Society*, 150(1): C36-C43 (Jan. 2003).

Li et al. "Chemical Mechanical Polishing of Copper and Tabtalum in Potassium Iodate-Based Slurries," *Electrochemical and Solid-State Letters*, 4(2): G20-G22 (Feb. 2001).

* cited by examiner

*Primary Examiner* — Pegah Parvini
(74) *Attorney, Agent, or Firm* — Thomas E Omholt; Susan L Steele; Steven D Weseman

(57) ABSTRACT

The invention provides compositions and methods for planarizing or polishing a substrate. The composition comprises an abrasive, iodate ion, a nitrogen-containing compound selected from the group consisting of a nitrogen-containing $C_{4-20}$ heterocycle and a $C_{1-20}$ alkylamine, and a liquid carrier comprising water.

7 Claims, 1 Drawing Sheet

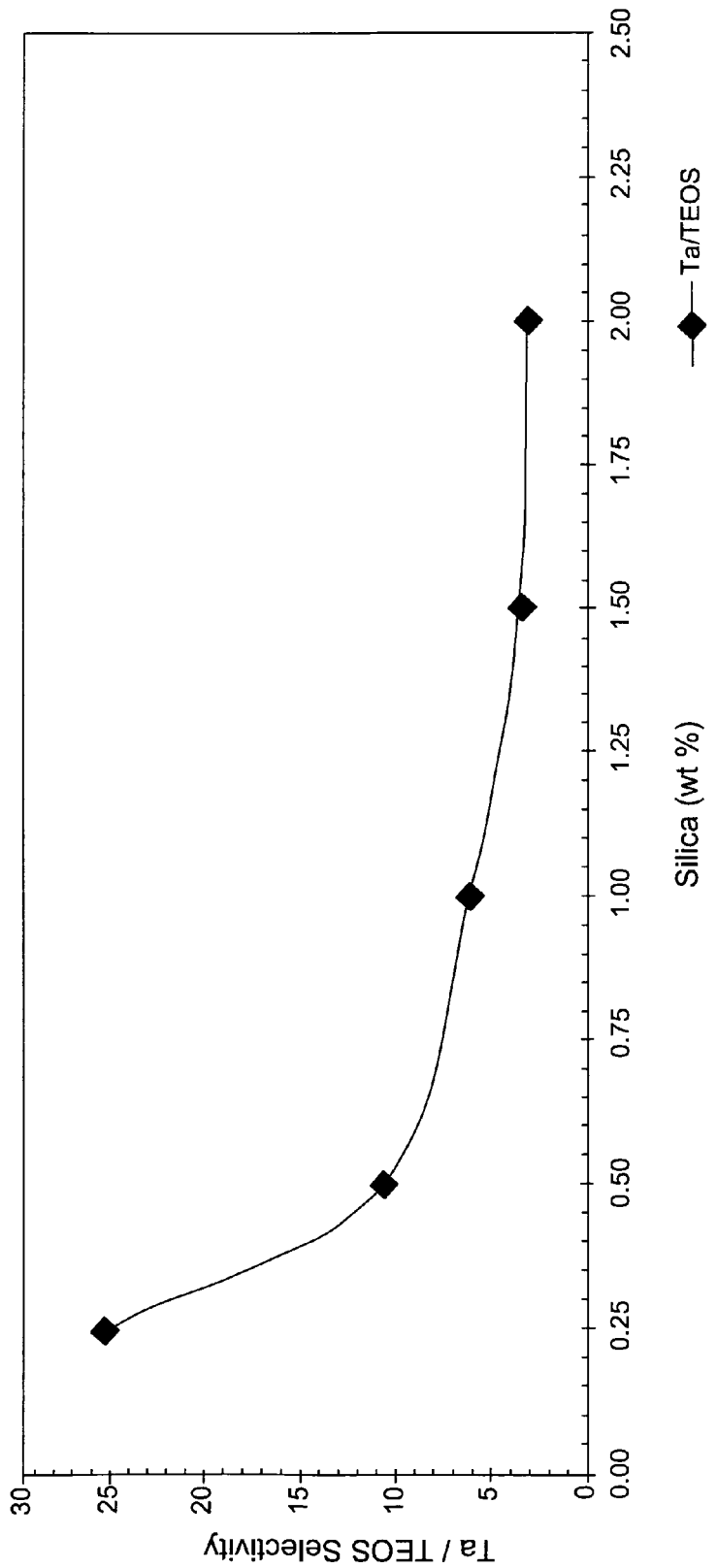

IODATE-CONTAINING
CHEMICAL-MECHANICAL POLISHING
COMPOSITIONS AND METHODS

FIELD OF THE INVENTION

This invention pertains to a chemical-mechanical polishing composition and a method of polishing a substrate using the same.

BACKGROUND OF THE INVENTION

Development of the next generation of semiconductor devices has emphasized the use of metals with lower resistivity values, such as copper, than previous generation metals in order to reduce capacitance between conductive layers on the devices and to increase the frequency at which a circuit can operate. One way to fabricate planar copper circuit traces on a silicon dioxide substrate is referred to as the damascene process. In accordance with this process, the silicon dioxide dielectric surface is patterned by a conventional dry etch process to form holes and trenches for vertical and horizontal interconnects. The patterned surface is coated with an adhesion-promoting layer such as tantalum or titanium and/or a diffusion barrier layer such as tantalum nitride or titanium nitride. The adhesion-promoting layer and/or the diffusion barrier layer are then over-coated with a copper layer. Chemical-mechanical polishing is employed to reduce the thickness of the copper over-layer, as well as the thickness of any adhesion-promoting layer and/or diffusion barrier layer, until a planar surface that exposes elevated portions of the silicon dioxide surface is obtained. The vias and trenches remain filled with electrically conductive copper forming the circuit interconnects.

Tantalum and tantalum nitride are particularly suitable materials for use in the damascene process as adhesion-promoting and/or diffusion barrier layers for copper-based devices. However, the properties of tantalum and of tantalum nitride differ from those of copper, being considerably more chemically inert, such that polishing compositions useful for the polishing of copper are often unsuitable for the removal of underlying tantalum and tantalum nitride. Typically, the polishing of tantalum layers requires compositions comprising an oxidizing agent, such as hydrogen peroxide, as well as high solids loading, i.e., >5 wt. % of abrasive based on the total weight of the composition, to achieve useful removal rates. However, hydrogen peroxide is a strong oxidizing agent that can react with other components of polishing compositions, which limits the stability of the polishing compositions and thus their useful pot-life. As such, hydrogen peroxide is usually added to the polishing composition by the end-user, i.e., it is used in so-called "two-pot" compositions entailing additional mixing steps in the polishing operation. Further, strong oxidizing agents such as hydrogen peroxide can erode copper lines on the substrate surface by chemical etching. High solids or abrasive loadings are also problematic. For example, high solids content can produce defects on the surface of the substrate that can negatively impact the performance of any integrated circuit layer manufactured from the substrate and can lower the tantalum to silicon dioxide selectivity. Furthermore, polishing compositions containing a high solids content are more expensive to produce.

Thus, there remains a need for improved polishing compositions and methods of polishing for substrates comprising tantalum and copper that are cost effective and decrease overall process time, such as by increasing the removal rate in tantalum.

BRIEF SUMMARY OF THE INVENTION

The invention provides a chemical-mechanical polishing composition for polishing a substrate comprising (a) about 0.05 wt. % to about 10 wt. % abrasive, (b) about 0.05 wt. % to about 4 wt. % iodate anion, (c) about 0.01 wt. % to about 1 wt. % nitrogen-containing compound selected from the group consisting of a nitrogen-containing $C_{4-20}$ heterocycle and a $C_{1-20}$ alkylamine, and (d) a liquid carrier comprising water, wherein the pH of the polishing composition is about 1 to about 5.

The invention further provides a method of chemically-mechanically polishing a substrate comprising (a) providing a substrate, (b) contacting the substrate with a polishing pad and a chemical-mechanical polishing composition comprising (i) about 0.05 wt. % to about 10 wt. % abrasive, (ii) about 0.05 wt. % to about 4 wt. % iodate anion, (iii) about 0.01 wt. % to about 1 wt. % nitrogen-containing compound selected from the group consisting of a nitrogen-containing $C_{4-20}$ heterocycle and a $C_{1-20}$ alkylamine, and (iv) a liquid carrier comprising water, wherein the pH of the polishing composition is about 1 to about 5, (c) moving the polishing pad relative to the substrate with the chemical-mechanical polishing composition therebetween, and (d) abrading at least a portion of the substrate to polish the substrate.

BRIEF DESCRIPTION OF THE SEVERAL
VIEWS OF THE DRAWINGS

The FIGURE is a graph of Ta/TEOS selectivity as a function of abrasive concentration.

DETAILED DESCRIPTION OF THE INVENTION

The invention provides a chemical-mechanical polishing composition for polishing a substrate. The polishing composition comprises (a) an abrasive, (b) iodate ions, (c) a nitrogen-containing compound, and (d) a liquid carrier comprising water. The polishing composition desirably allows for higher and tunable metal removal rates at relatively lower abrasive concentrations.

The polishing composition comprises iodate ions ($IO_3^-$). Iodate ions function as oxidizing agents. The iodate ions can be present in the polishing composition in any suitable amount. Typically, the iodate ions are present in the polishing composition in an amount of about 0.01 wt. % or more, preferably about 0.05 wt. % or more, and more preferably about 0.1 wt. % or more, based on the total weight of the polishing composition. Typically, the iodate ions are present in the polishing composition in an amount of about 4 wt. % or less, preferably about 2 wt. % or less, more preferably 1 wt. % or less, and most preferably 0.4 wt. % or less, based on the total weight of the polishing composition.

The iodate ions are obtained in solution by any suitable technique, typically by dissolving in water any suitable iodate salt. Examples of iodate salts include but are not limited to sodium iodate, potassium iodate, ammonium iodate, calcium iodate, cesium iodate, lithium iodate, and magnesium iodate. Alternatively, iodate ions are obtained by dissolving iodic acid in water.

Desirably, iodate ions are more stable than peroxide oxidizers. Thus, the polishing composition comprising iodate ions can be supplied to the end-user as a one package system, i.e., a so-called "one-pot" composition.

The polishing composition further comprises a nitrogen-containing compound. The nitrogen-containing compound can be any suitable nitrogen-containing compound. The choice of nitrogen-containing compound will typically depend on the particular substrate to be polished. Typically, the nitrogen-containing compound is a nitrogen-containing $C_{4-20}$ heterocycle or a $C_{1-20}$ alkylamine. Preferably, the nitrogen-containing compound is selected from the group consisting of 1H-1,2,3-benzotriazole, 1H-1,2,3-benzotriazole-5-carboxylic acid, 1,2,4-triazole, 5-methyl-1H-benzotriazole, 4-amino-1,2,4-triazole, 1H-benzotriazole-1-carboxaldehyde, 3-amino-1,2,4,-triazole-5-carboxylic acid, pyrazole, 2-pyrazinecarboxylic acid, 2,6-pyridinecarboxylic acid, 4-pyridylacetic acid, 1H-1,2,3-triazolo[4,5-b]pyridine, methylamine, trimethylamine, ethylamine, triethylamine, salts thereof, and combinations thereof. In a preferred embodiment, the nitrogen-containing compound is 1H-1,2,3-benzotriazole, 5-methyl-1H-benzotriazole, or a combination thereof.

The nitrogen-containing compound can be present in any suitable amount. Typically, the nitrogen-containing compound is present in the polishing composition in an amount of about 0.01 wt. % or more, preferably about 0.05 wt. % or more, and more preferably about 0.1 wt. % or more, based on the total weight of the polishing composition. Typically, the nitrogen-containing compound is present in the polishing composition in an amount of about 1 wt. % or less, preferably about 0.5 wt. % or less, and more preferably 0.25 wt. % or less, based on the total weight of the polishing composition.

It has been unexpectedly found that the removal rate of tantalum is greater for the inventive composition comprising a nitrogen-containing compound and iodate ions as compared to alternative oxidizing agents. Increasing the removal rate in tantalum polishing is expected to reduce the overall process time.

The polishing composition additionally comprises an abrasive. Significantly, it has been discovered that high tantalum removal rates can be achieved with chemical-mechanical polishing compositions comprising a relatively low solids content in conjunction with an iodate oxidizing agent. Typically, the abrasive is present in the polishing composition in an amount of about 0.05 wt. % or more, (e.g., about 0.1 wt. % or more, or about 0.25 wt. % or more), based on the total weight of the polishing composition. Typically, the abrasive is present in the polishing composition in an amount of about 10 wt. % or less, (e.g., about 5 wt. % or less, about 2 wt. % or less, about 1 wt. % or less, about 0.75 wt. % or less, or about 0.5 wt. % or less), based on the total weight of the polishing composition.

The abrasive can be any suitable abrasive, many of which are well known in the art. The abrasive desirably comprises a metal oxide. Suitable metal oxides include metal oxides selected from the group consisting of alumina, silica, titania, ceria, zirconia, germania, magnesia, co-formed products thereof, and combinations thereof. Preferably, the metal oxide is silica. The silica can be any suitable form of silica. Useful forms of silica include but are not limited to fumed silica, precipitated silica, and condensation-polymerized silica. Most preferably, the silica is condensation-polymerized silica. Condensation-polymerized silica particles typically are prepared by condensing $Si(OH)_4$ to form colloidal particles. Such abrasive particles can be prepared in accordance with U.S. Pat. No. 5,230,833 or can be obtained as any of various commercially available products, such as the Fuso PL-1 and PL-2 products, Akzo-Nobel Bindzil 50/80 product, and the Nalco 1050, 2327, and 2329 products, as well as other similar products available from DuPont, Bayer, Applied Research, Nissan Chemical, and Clariant.

The abrasive particles can have any suitable size. The abrasive particles typically have an average particle size (e.g., average particle diameter) of about 5 nm to about 250 nm. Preferably, the abrasive particles have an average particle size of about 10 nm to about 100 nm. Most preferably, the abrasive particles have an average particle size of about 25 nm to about 80 nm. The particle size of a non-spherical particle is the diameter of the smallest sphere that encompasses the particle.

A liquid carrier is used to facilitate the application of the abrasive and any components dissolved or suspended therein to the surface of a suitable substrate to be polished (e.g., planarized). The liquid carrier is typically an aqueous carrier and can be water alone (i.e., can consist of water), can consist essentially of water, can comprise water and a suitable water-miscible solvent, or can be an emulsion. Suitable water-miscible solvents include alcohols, such as methanol, ethanol, etc., and ethers, such as dioxane and tetrahydrofuran. Preferably, the aqueous carrier comprises, consists essentially of, or consists of water, more preferably deionized water.

The polishing composition can have any suitable pH. For example, the polishing composition can have a pH of about 1 to about 5. Typically, the polishing composition has a pH of about 2 or greater. The pH of the polishing composition typically is about 4 or less.

The pH of the polishing composition can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be nitric acid, potassium hydroxide, or a combination thereof. The pH buffering agent can be any suitable buffering agent, for example, phosphates, sulfates, acetates, borates, ammonium salts, and the like. The polishing composition can comprise any suitable amount of a pH adjustor and/or a pH buffering agent, provided that a suitable amount is used to achieve and/or maintain the pH of the polishing composition within the pH ranges set forth.

The polishing system optionally comprises a corrosion inhibitor (i.e., a film-forming agent). The corrosion inhibitor can be any suitable corrosion inhibitor for any component(s) of the substrate. Preferably, the corrosion inhibitor is a copper-corrosion inhibitor. For the purposes of this invention, a corrosion inhibitor is any compound, or mixture of compounds, that facilitates the formation of a passivation layer (i.e., a dissolution-inhibiting layer) on at least a portion of the surface being polished. The polishing system of the invention can comprise any suitable amount of the corrosion inhibitor. Generally, the polishing composition of the polishing system comprises about 0.005 wt. % to about 1 wt. % (e.g., about 0.01 to about 0.5 wt. %, or about 0.02 to about 0.2 wt. %) of the corrosion inhibitor.

The polishing composition optionally further comprises one or more other additives. The polishing composition can comprise a surfactant and/or rheological control agent, including viscosity enhancing agents and coagulants (e.g., polymeric rheological control agents, such as, for example, urethane polymers). Suitable surfactants include, for example, cationic surfactants, anionic surfactants, anionic polyelectrolytes, nonionic surfactants, amphoteric surfactants, fluorinated surfactants, mixtures thereof, and the like.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., nitrogen-containing compound, abrasive, etc.) as well as any combination of ingredients (e.g., nitrogen-containing compound, source of iodate ions, surfactants, etc.).

For example, the abrasive can be dispersed in a suitable liquid carrier. A source of iodate ions and a nitrogen-containing compound then can be added, and mixed by any method that is capable of incorporating the components into the polishing composition. The polishing composition can be prepared prior to use, with one or more components, such as the source of iodate ions, added to the polishing composition just before use (e.g., within about 1 minute before use, or within about 1 hour before use, or within about 7 days before use). The polishing composition also can be prepared by mixing the components at the surface of the substrate during the polishing operation.

The polishing composition can be supplied as a one-package system comprising a source of iodate ions, a nitrogen-containing compound, an abrasive, and a liquid carrier. Alternatively, the abrasive can be supplied as a dispersion in a liquid carrier in a first container, and a source of iodate ions can be supplied in a second container, either in dry form, or as a solution or dispersion in the liquid carrier. A nitrogen-containing compound can be placed in the first and/or second containers or a third container. Furthermore, the components in the first or second container can be in dry form while the components in the remaining container(s) can be in the form of an aqueous dispersion. Moreover, it is suitable for the components in the first or second containers to have different pH values, or alternatively to have substantially similar, or even equal, pH values. The iodate oxidizing agent can be supplied separately from the other components of the polishing composition and can be combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). Other two-container, or three or more container, combinations of the components of the polishing composition are within the knowledge of one of ordinary skill in the art.

In a preferred embodiment, the polishing composition is supplied as a one-package system.

The polishing composition of the invention also can be provided as a concentrate which is intended to be diluted with an appropriate amount of liquid carrier prior to use. In such an embodiment, the polishing composition concentrate can comprise the abrasive, iodate ions, a nitrogen-containing compound, and a liquid carrier in amounts such that, upon dilution of the concentrate with an appropriate amount of liquid carrier, each component of the polishing composition will be present in the polishing composition in an amount within the appropriate range recited above for each component. For example, the abrasive, iodate ions, and nitrogen-containing compound can each be present in the concentration in an amount that is about 2 times (e.g., about 3 times, about 4 times, or about 5 times) greater than the concentration recited above for each component so that, when the concentrate is diluted with an equal volume of liquid carrier (e.g., 2 equal volumes of liquid carrier, 3 equal volumes of liquid carrier, or 4 equal volumes of liquid carrier, respectively), each component will be present in the polishing composition in an amount within the ranges set forth above for each component. Furthermore, as will be understood by those of ordinary skill in the art, the concentrate can contain an appropriate fraction of the liquid carrier present in the final polishing composition in order to ensure that the iodate ions, nitrogen-containing compound, and other suitable additives are at least partially or fully dissolved in the concentrate.

The invention also provides a method of polishing a substrate with the polishing composition described herein. The method of polishing a substrate comprises (i) contacting a substrate with the aforementioned polishing composition, and (ii) abrading or removing at least a portion of the substrate to polish the substrate.

In particular, the invention further provides a method of chemically-mechanically polishing a substrate comprising (a) providing a substrate, (b) contacting the substrate with a polishing pad and a chemical-mechanical polishing composition comprising (i) about 0.05 wt. % to about 10 wt. % abrasive, (ii) about 0.05 wt. % to about 4 wt. % iodate anion, (iii) about 0.01 wt. % to about 1 wt. % nitrogen-containing compound selected from the group consisting of a nitrogen-containing $C_{4-20}$ heterocycle and a $C_{1-20}$ alkylamine, and (iv) a liquid carrier comprising water, wherein the pH of the polishing composition is about 1 to about 5, (c) moving the polishing pad relative to the substrate with the chemical-mechanical polishing composition therebetween, and (d) abrading at least a portion of the substrate to polish the substrate.

Although the polishing composition of the invention is useful for polishing any substrate, the polishing composition is particularly useful in the polishing of a substrate comprising at least one metal layer comprising tantalum. The substrate can be any suitable tantalum-containing substrate (e.g., an integrated circuit, metals, ILD layers, semiconductors, and thin films) and can further comprise any suitable insulating layer and/or other metal or metal alloy layer (e.g., metal conductive layer). The insulating layer can be a metal oxide, glass, organic polymer, fluorinated organic polymer, or any other suitable high or low-k insulating layer. The insulating layer preferably is a silicon-based metal oxide. The additional metal or metal alloy layer can be any suitable metal or metal alloy layer. The tantalum-containing substrate preferably further comprises a metal layer comprising copper.

In accordance with the invention, a substrate can be planarized or polished with the polishing composition described herein by any suitable technique. The polishing method of the invention is particularly suited for use in conjunction with a chemical-mechanical polishing (CMP) apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be planarized or polished with the polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

EXAMPLES

The following examples further illustrate the invention but, of course, should not be construed as in any way limiting its scope.

In each of the following examples, tantalum, copper, and TEOS blanket wafers were polished with different polishing compositions using a conventional CMP apparatus. The polishing parameters were as follows: 9.3 kPa (1.35 psi) to 10.4 kPa (1.5 psi) downforce pressure of the substrate on the carrier against the polishing pad on the platen, 110 rpm platen speed, 102 rpm carrier speed, at a polishing composition flow rate of 150 ml/min. Following polishing, the removal rate of tantalum, copper, and dielectric oxide from the blanket wafers was determined in Å/min.

Example 1

This example evaluates the effect of iodate concentration on removal rate of tantalum, copper, and dielectric oxide with the polishing composition of the invention.

Similar substrates comprising a blanket layer of tantalum, copper, and TEOS were polished with six different polishing compositions (Polishing Compositions 1A, 1B, 1C, 1D, 1E, and 1F). Each of the polishing compositions contained 0.5 wt. % condensation-polymerized silica (80 nm diameter) and 0.1 wt. % benzotriazole in water at a pH of 2.4. Polishing Compositions 1A-1F further contained 0.01 wt. %, 0.025 wt. %, 0.05 wt. %, 0.1 wt. %, 0.2 wt. %, and 0.25 wt. % $KIO_3$, respectively. The tantalum, copper, and TEOS removal rate results are set forth in Table 1.

TABLE 1

Material Removal Rates as a Function of Iodate Concentration

| Polishing Composition | $KIO_3$ (wt. %) | Tantalum Removal Rate (Å/min) | Copper Removal Rate (Å/min) | TEOS Removal Rate (Å/min) |
|---|---|---|---|---|
| 1A | 0.01 | 320 | 200 | <50 |
| 1B | 0.025 | 470 | 300 | 100 |
| 1C | 0.05 | 740 | 900 | 100 |
| 1D | 0.1 | 1080 | 2400 | 100 |
| 1E | 0.2 | 330 | 3400 | 100 |
| 1F | 0.25 | 310 | 3600 | 100 |

These results demonstrate that the dielectric oxide (TEOS) removal rate is largely independent of iodate concentration. In contrast, tantalum and copper removal rates are strongly dependent on iodate concentration. The copper rate increases over the range of iodate concentrations. The tantalum removal rate reaches a maximum of >1000 Å/min at an intermediate iodate concentration near 0.1 wt. %. A high tantalum removal rate of >1000 Å/min is not achieved with conventional oxidizers at similarly low abrasive loadings, e.g., 0.5 wt. %.

Example 2

This example evaluates the effect of abrasive concentration on removal rate of tantalum, copper, and dielectric oxide with the polishing composition of the invention.

Similar substrates comprising a blanket layer of tantalum, copper, and TEOS were polished with five different polishing compositions (Polishing Compositions 2A, 2B, 2C, 2D, and 2E). Each of the polishing compositions contained 0.05 wt. % $KIO_3$ and 0.1 wt. % of benzotriazole (BTA) in water at a pH of 2.4. Polishing Compositions 2A-2E further contained 0.25 wt. %, 0.5 wt. %, 1 wt. %, 1.5 wt. %, and 2 wt. % condensation-polymerized silica (80 nm diameter), respectively. The tantalum, copper, and TEOS removal rates are set forth in Table 2.

TABLE 2

Material Removal Rates as a Function of Abrasive Concentration

| Polishing Composition | Silica (wt. %) | Tantalum Removal Rate (Å/min) | Copper Removal Rate (Å/min) | TEOS Removal Rate (Å/min) |
|---|---|---|---|---|
| 2A | 0.25 | 690 | 800 | <25 |
| 2B | 0.5 | 750 | 1000 | <50 |
| 2C | 1 | 900 | 1550 | 100 |
| 2D | 1.5 | 890 | 1300 | 250 |
| 2E | 2 | 900 | 1250 | 340 |

These results demonstrate that the dielectric oxide (TEOS) removal rate is strongly dependent on abrasive concentration. In contrast, tantalum and copper removal rates are relatively independent of abrasive concentration. The graph of the FIGURE depicts the Ta/TEOS selectivity as a function of abrasive concentration. This graph demonstrates the increase in Ta/TEOS selectivity at lower abrasive concentrations.

Example 3

This example evaluates the dependence of material removal rates on pH.

Similar substrates comprising a blanket layer of tantalum, copper, and TEOS were polished with six different polishing compositions (Polishing Compositions 3A, 3B, 3C, 3D, 3E, and 3F). Each of the polishing compositions contained 0.1 wt. % $KIO_3$, 0.1 wt. % BTA, and 0.5 wt. % condensation-polymerized silica (80 nm diameter). Polishing Compositions 3A had a pH of 2.19, Polishing Composition 3B had a pH of 2.45, Polishing Composition 3C had a pH of 2.6, Polishing Composition 3D had a pH of 2.8, Polishing Composition 3E had a pH of 3.12, and Polishing Composition 3F had a pH of 3.67. The tantalum, copper, and TEOS removal rate results are set forth in Table 3.

TABLE 3

Material Removal Rates as a Function of pH

| Polishing Composition | pH | Tantalum Removal Rate (Å/min) | Copper Removal Rate (Å/min) | TEOS Removal Rate (Å/min) |
| --- | --- | --- | --- | --- |
| 3A | 2.19 | 828 | 3305 | 100 |
| 3B | 2.45 | 1011 | 2850 | 36 |
| 3C | 2.6 | 1073 | 2122 | 51 |
| 3D | 2.8 | 764 | 1736 | 17 |
| 3E | 3.12 | 338 | 691 | 27 |
| 3F | 3.67 | 12 | 213 | 46 |

These results demonstrate the strong dependence of tantalum, copper, and TEOS removal rates on the pH of the polishing compositions comprising $KIO_3$.

Example 4

This example evaluates the effect of nitrogen-containing compounds on removal rate of tantalum and copper with the polishing composition of the invention.

Similar substrates comprising a blanket layer of tantalum and copper were polished with five different polishing compositions (Polishing Compositions 4A, 4B, 4C, 4D, and 4E). Each of the polishing compositions contained 0.05 wt. % $KIO_3$ and 0.5 wt. % condensation-polymerized silica (80 nm diameter) in water at pH of 2.6. Polishing Composition 4A contained no benzotriazole ("BTA"), Polishing Compositions 4B-4E further contained 0.025 wt. %, 0.05 wt. %, 0.1 wt. %, and 0.2 wt. % BTA, respectively. The tantalum and copper removal rate results are set forth in Table 4

TABLE 4

Material Removal Rates as a Function of BTA Concentration

| Polishing Composition | BTA (wt. %) | Tantalum Removal Rate (Å/min) | Copper Removal Rate (Å/min) |
| --- | --- | --- | --- |
| 4A (comparative) | 0 | 530 | 1200 |
| 4B (invention) | 0.025 | 600 | 3600 |
| 4C (invention) | 0.05 | 610 | 1900 |
| 4D (invention) | 0.1 | 710 | 1000 |
| 4E (invention) | 0.2 | 700 | 500 |

BTA is a well-known inhibitor of copper removal. However, as is apparent from the results set forth in Table 4, BTA increased tantalum removal rates in combination with iodate. The tantalum removal rate increased with increasing BTA concentration and reached a plateau at a concentration of 0.1 wt. % BTA. Polishing Composition 4D exhibited a tantalum removal rate that was approximately 60% greater than observed for a polishing composition without BTA, i.e., Polishing Composition 4A. The copper removal rate first increased and then decreased with increasing concentration of BTA.

Example 5

This example evaluates the synergism between iodate and nitrogen-containing compounds, such as BTA, for enhancing tantalum removal rates.

Similar substrates comprising a blanket layer of tantalum were polished with six different polishing compositions (Polishing Compositions 5A, 5B, 5C, 5D, 5E, and 5F). Polishing Composition 5A (comparative) contained 0.5 wt. % condensation-polymerized silica (80 nm diameter) and 0.05 wt. % $KIO_3$ in water at a pH of 2.4. Polishing Composition 5B (invention) contained 0.1 wt. % BTA, 0.5 wt. % condensation-polymerized silica (80 nm diameter), and 0.05 wt. % $KIO_3$ in water at a pH of 2.4. Polishing Composition 5C (comparative) contained 12 wt. % condensation-polymerized silica (25 nm diameter), 1 wt. % $H_2O_2$, and 40 ppm of calcium acetate at a pH of 9. Polishing Composition 5D (comparative) contained 0.1 wt. % BTA, 12 wt. % condensation-polymerized silica (25 nm diameter), 1 wt. % $H_2O_2$, and 40 ppm of calcium acetate at a pH of 9. The tantalum removal rate results are set forth in Table 5.

TABLE 5

Material Removal Rates of Different Compositions

| Polishing Composition | Tantalum Removal Rate (Å/min) |
| --- | --- |
| 5A (comparative) | 470 |
| 5B (invention) | 756 |
| 5C (comparative) | 244 |
| 5D (comparative) | 284 |

As is apparent from the tantalum removal rate results set forth in Table 5, Polishing Composition 5B, comprising iodate and BTA, exhibited an enhanced tantalum removal rate as compared to Polishing Composition 5A which contained a similar amount of iodate but no BTA. The polishing composition containing $H_2O_2$, alone or with BTA, but no iodate, i.e., Polishing Compositions 5C and 5D, did not exhibit synergy with BTA for increasing the tantalum removal rate.

Example 6

This example evaluates the effectiveness of different nitrogen-containing compounds in the inventive composition.

Similar substrates comprising a blanket layer of tantalum, copper, and TEOS were polished with 16 different polishing compositions (Polishing Compositions 6A, 6B, 6C, 6D, 6E, 6F, 6G, 6H, 6I, 6J, 6K, 6L, 6M, 6N, 6O, and 6P). Each of the polishing compositions contained 0.1 wt. % $KIO_3$ and 0.5 wt. % condensation-polymerized silica (80 nm diameter) in water at a pH of 2.6. Polishing Composition 6A contained no BTA, Polishing Composition 6B contained 0.1 wt. % BTA, Polishing Composition 6C contained 0.01 wt. % 1H-1,2,3-benzotriazole-5-carboxylic acid, Polishing Composition 6D contained 0.1 wt. % 1,2,4-triazole, Polishing Composition 6E contained 0.1 wt. % pyrazole, Polishing Composition 6F contained 0.1 wt. % 2,pyrazinecarboxylic acid, Polishing Composition 6G contained 0.1 wt. % 4-pyridylacetic acid hydrochloride, Polishing Composition 6H contained 0.1 wt. % 4, amino-1,2,4-triazole, Polishing Composition 6I contained 3,5-diamino-1,2,4-triazole, Polishing Composition 6J contained 0.1 wt. % 2,6-pyridinedicarboxylic acid, Polishing Composition 6K contained 0.1 wt. % 5-methyl-1H-benzotriazole, Polishing Composition 6L contained 0.002 wt. % 3-amino-1,2,4-triazole-5-carboxylic acid, Polishing Composition 6M contained 0.02 wt. % 1H-1,2,3-benzotrizole-5-carboxylic acid, Polishing Composition 6N contained 0.02 wt. % 1H,1,2,3-triazolo[4,5b]pyridine, Polishing Composition 6O contained 0.1 wt. % methylamine, and Polishing Composition 6P contained 0.1 wt. % trimethylamine. The tantalum, copper, and TEOS removal rate results are set forth in Table 6.

TABLE 6

Material Removal Rates as a Function of Different Nitrogen-Containing Compounds

| Polishing Composition | Tantalum Removal Rate (Å/min) | Copper Removal Rate (Å/min) | TEOS Removal Rate (Å/min) |
|---|---|---|---|
| 6A (comparative) | 338 | 884 | 35 |
| 6B (invention) | 804 | 1326 | 6 |
| 6C (invention) | 488 | 2025 | 25 |
| 6D (invention) | 565 | 3338 | 56 |
| 6E (invention) | 560 | 1911 | 63 |
| 6F (invention) | 584 | 721 | 43 |
| 6G (invention) | 579 | 399 | 72 |
| 6H (invention) | 577 | 2133 | 60 |
| 6I (invention) | 9 | 131 | 20 |
| 6J (invention) | 567 | 163 | 63 |
| 6K (invention) | 995 | 1536 | 62 |
| 6L (invention) | 622 | 1962 | 68 |
| 6M (invention) | 636 | 3035 | 0 |
| 6N (invention) | 825 | 3555 | 47 |
| 6O (invention) | 466 | 913 | 76 |
| 6P (invention) | 524 | 1515 | N/A |

As is apparent from the results set forth in Table 6, all of the nitrogen-containing compounds except 3,5-diamino-1,2,4-triazole exhibited enhanced tantalum removal rates in conjunction with iodate.

Example 7

This example evaluates the effectiveness of different abrasives in the inventive composition.

Similar substrates comprising a blanket layer of tantalum, copper, and TEOS were polished with six different polishing compositions (Polishing Compositions 7A, 7B, 7C, 7D, 7E, and 7F). Polishing Composition 7A contained 0.2 wt. % $KIO_3$, and 1 wt. % condensation-polymerized silica (25 nm diameter) in water at a pH of 2.2. Polishing Composition 7B contained 0.05 wt. % $KIO_3$ and 0.5 wt. % condensation-polymerized silica (80 nm diameter) in water at a pH of 2.4. Polishing Composition 7C contained 0.2 wt. % $KIO_3$ and 0.5 wt. % fumed silica in water at a pH of 2.2. Polishing Composition 7D contained 0.2 wt. % $KIO_3$ and 0.5 wt. % fumed alumina in water at a pH of 2.2. Polishing Composition 7E contained 0.2 wt. % $KIO_3$ and 0.5 wt. % alpha alumina in water at a pH of 2.2. Polishing Composition 7F contained 1 wt. % $KIO_3$ and 1 wt. % ceria in water at a pH of 2.1. The tantalum, copper, and TEOS removal rate results are set forth in Table 7

TABLE 7

Material Removal Rates as a Function of Abrasive Type

| Polishing Composition | Abrasive | Tantalum Removal Rate (Å/min) | Copper Removal Rate (Å/min) | TEOS Removal Rate (Å/min) |
|---|---|---|---|---|
| 7A | 25 nm silica | 558 | 4442 | |
| 7B | 80 nm silica | 470 | 1606 | 62 |
| 7C | fumed silica | 74 | 2687 | 79 |
| 7D | fumed alumina | 38 | 3195 | 58 |
| 7E | α-alumina | 39 | | |
| 7F | ceria | 55 | | |

As is apparent from the tantalum removal rates set forth in Table 7, the use of condensation-polymerized silica in polishing compositions comprising $KIO_3$ exhibited enhanced tantalum removal rates.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition for polishing a substrate comprising:
    (a) about 0.25 wt. % to about 0.75 wt. % colloidal silica abrasive having an average particle size of about 25 nm to about 80 nm,
    (b) about 0.05 wt. % to about 0.1 wt. % iodate ion,
    (c) about 0.05 wt. % to about 0.1 wt. % 1H-1,2,3-benzotriazole, and
    (d) a liquid carrier comprising water,
  wherein the pH of the polishing composition is 2.4-2.8.

2. The polishing composition of claim 1, wherein the silica abrasive is present in an amount of about 0.25 wt. % to about 0.5 wt. %.

3. A method of chemically-mechanically polishing a substrate, which method comprises:
    (a) providing a substrate,
    (b) contacting the substrate with a polishing pad and a chemical-mechanical polishing composition comprising:
        (i) about 0.25 wt. % to about 0.75 wt. % colloidal silica abrasive having an average particle size of about 25 nm to about 80 nm,
        (ii) about 0.05 wt. % to about 0.1 wt. % iodate ion,
        (iii) about 0.05 wt. % to about 0.1 wt. % 1H-1,2,3-benzotriazole, and
        (iv) a liquid carrier comprising water, wherein the pH of the polishing composition is 2.4-2.8,
  (c) moving the polishing pad relative to the substrate with the chemical-mechanical polishing composition therebetween, and
  (d) abrading at least a portion of the substrate to polish the substrate.

4. The method of claim 3, wherein the silica abrasive is present in an amount of about 0.25 wt. % to about 0.5 wt. %.

5. The method of claim 3, wherein the substrate comprises a metal layer.

6. The method of claim 5, wherein the metal layer comprises tantalum.

7. The method of claim 6, wherein the metal layer further comprises copper.

\* \* \* \* \*